(12) United States Patent
Choe et al.

(10) Patent No.: US 7,928,431 B2
(45) Date of Patent: Apr. 19, 2011

(54) ORGANIC LIGHT EMITTING DISPLAY APPARATUS

(75) Inventors: Won-Kyu Choe, Suwon-si (KR); Ji-Yeon Baek, Suwon-si (KR)

(73) Assignee: Samsung Mobile Display Co., Ltd., Yongin (KR)

(*) Notice: Subject to any disclaimer, the term of this patent is extended or adjusted under 35 U.S.C. 154(b) by 510 days.

(21) Appl. No.: 11/935,304

(22) Filed: Nov. 5, 2007

(65) Prior Publication Data

US 2008/0142807 A1    Jun. 19, 2008

(30) Foreign Application Priority Data

Dec. 13, 2006    (KR) .................. 10-2006-0127305

(51) Int. Cl.
*H01L 35/24* (2006.01)
*H01L 51/00* (2006.01)

(52) U.S. Cl. ........... 257/40; 313/483; 313/500; 313/512
(58) Field of Classification Search .................... 257/40; 313/483, 500, 512
See application file for complete search history.

(56) References Cited

U.S. PATENT DOCUMENTS

| 7,157,847 B2* | 1/2007 | Kawachi et al. ............. 313/495 |
| 2002/0003397 A1* | 1/2002 | Yamazaki .................... 313/483 |
| 2004/0012747 A1 | 1/2004 | Yamazaki et al. |
| 2004/0032202 A1 | 2/2004 | Fukunaga |
| 2005/0082970 A1* | 4/2005 | Yamazaki et al. ............ 313/506 |
| 2005/0179377 A1 | 8/2005 | Shitagami et al. |

FOREIGN PATENT DOCUMENTS

| CN | 1499908 A | 5/2004 |
| JP | 08-111286 | 4/1996 |
| JP | 2002-151253 A | 5/2002 |
| JP | 2004-006137 | 1/2004 |
| JP | 2005-258395 | 9/2005 |
| JP | 2006-278021 | 10/2006 |
| KR | 10-2004-0036545 A | 4/2004 |
| KR | 10-2006-0115829 A | 11/2006 |

OTHER PUBLICATIONS

Japanese Office Action dated Feb. 23, 2010.
Registration Determination Certificate issued on Jun. 12, 2008 by the Korean Patent Office in Korean Patent Application No. 10-2006-0127305.
Chinese Office Action dated May 21, 2010.
Office Action dated Jun. 22, 2010 issued by Japanese Patent Office in Application No. JP 2007-194559.

* cited by examiner

*Primary Examiner* — Kenneth A Parker
*Assistant Examiner* — Anthony Ho
(74) *Attorney, Agent, or Firm* — Knobbe Martens Olson & Bear, LLP.

(57) ABSTRACT

An organic light emitting display apparatus with reduced infiltration of external moisture and oxygen comprises: a substrate comprising a plurality of TFT devices; and a display region formed on the substrate; wherein the display region comprises a base layer which comprises first electrodes electrically connected to the TFT devices and defining a pixel region, an organic layer formed on the base layer, and a second electrode layer formed in a structure covering the base layer and organic layer completely.

20 Claims, 7 Drawing Sheets

ORGANIC LIGHT EMITTING DISPLAY APPARATUS

CROSS-REFERENCE TO RELATED PATENT APPLICATION

This application claims the benefit of Korean Patent Application No. 10-2006-0127305, filed on Dec. 13, 2006 in the Korean Intellectual Property Office, the disclosure of which is incorporated by reference herein in its entirety.

BACKGROUND

1. Technical Field

This disclosure relates generally to an organic light emitting display apparatus, and more particularly, to an organic light emitting display apparatus that resists deterioration of organic emission layers from contact with impurities such as oxygen and moisture.

2. Description of the Related Art

Organic light emitting display apparatuses have emission layers formed of organic substances disposed between a pixel electrode and an opposite electrode. In embodiments of organic light emitting display apparatuses, when positive and negative voltages are applied to the electrodes, holes injected from the pixel electrode move into a emission layer through a hole transport layer, and electrons injected from the opposite electrode move to the emission layer through an electron transport layer. The electrons and holes combine, forming excitons in the emission layer. As the excitons relax from an excited state to a ground state, they transfer energy to phosphor molecules in the emission layer, causing the phosphor molecules to emit light, thereby forming images.

Embodiments of organic light emitting apparatuses are regarded as next-generation display devices because of their fast response times, wide viewing angles, and excellent contrasts. However, organic layers, including organic emission layers, can be moisture and oxygen sensitive, and thus, the life span of devices is seriously degraded when moisture and/or oxygen infiltrates into the display regions of the light emitting units.

In typical organic light emitting display apparatuses, the peripheries of a display region are encapsulated with a metal cap or an encapsulating substrate, and sealed thereto with a sealant. Furthermore, some embodiments comprise a moisture absorbent within the sealed space. However, these methods do not sufficiently block external oxygen or moisture in many cases.

SUMMARY OF THE INVENTION

Provided herein is an organic light emitting display apparatus that resists infiltration of external moisture and oxygen.

Some embodiments provide an organic light emitting display apparatus comprising: a substrate comprising a plurality of thin film transistor (TFT) devices; and a display region formed on the substrate, wherein the display region comprises: a base layer comprising first electrodes, which are electrically connected to the TFT devices, and defining a pixel region; an organic layer formed on the base layer; and a second electrode layer formed as a structure entirely covering the base layer and organic layers.

The organic layer can comprise at least an emission layer containing small-molecule organic substances.

The organic layer can be at least one of a hole injection layer, a hole transport layer, an electron injection layer, an electron transport layer, and a hole blocking layer.

The base layer can further comprise a pixel defining layer that is formed between the first electrodes with a predetermined thickness.

The base layer can further comprise a dummy pixel region.

The organic light emitting display apparatus can further comprise an electrode wiring portion electrically connected to the second electrode layer in one side of the display region, and the electrode wiring portion can be formed so that the second electrode layer can cover the electrode wiring portion.

The organic light emitting display apparatus can further comprise a planarization film between the TFT devices and the first electrodes.

The second electrode layer can be formed of a light permeable material.

The organic light emitting display apparatus can further comprise a device unit sending various kinds of signals to the display region and a power supply unit supplying electric power to the display region, wherein the device unit and the power supply unit are formed on the substrate.

The organic light emitting display apparatus can further comprise an encapsulating structure sealing the display region, the encapsulating structure being formed on the substrate.

The encapsulating structure can be formed by alternately depositing organic layers and inorganic layers on the display region.

Other embodiments provide an organic light emitting display apparatus comprising: a substrate comprising a plurality of TFT devices; and a display region formed on the substrate, wherein the display region comprises: a base layer comprising first electrodes electrically connected to the TFT devices and defining a pixel region; an organic layer formed on the base layer; and a second electrode layer extending past the periphery of the organic layer by more than 100 μm.

The organic layer comprises an emission layer containing at least a small-molecule organic substance.

The organic layer is at least one of a hole injection layer, a hole transport layer, an electron injection layer, an electron transport layer, and a hole blocking layer.

The base layer can further comprise a pixel defining layer with a predetermined thickness, formed between the first electrodes.

The base layer further comprises a dummy pixel region.

The organic light emitting display apparatus can further comprise an electrode wiring portion electrically connected to the second electrode layer on one side of the display region, and the electrode wiring portion can be formed so that the second electrode layer can cover the electrode wiring portion.

The organic light emitting display apparatus can further comprise a planarization film between the TFT devices and the first electrodes.

The second electrode layer can be formed of a light permeable material.

The organic light emitting display apparatus can further comprise a device unit sending various kinds of signals to the display region and/or a power supply unit supplying electric power to the display region.

The organic light emitting display apparatus can further comprise an encapsulating structure that is formed on the substrate and seals the display region.

The encapsulating structure can be formed by alternately depositing organic layers and inorganic layers.

Other embodiments provide an organic light emitting display apparatus comprising: a substrate comprising a plurality of thin film transistor (TFT) devices; and a display region formed on the substrate, wherein the display region comprises: a base layer comprising a plurality of pixel defining layers and a plurality of first electrodes electrically coupled to the TFT devices; an organic layer covering the plurality of pixel defining layers and the plurality of first electrodes, wherein the organic layer comprises an organic emission layer disposed on the first electrodes and between the pixel defining layers; and a second electrode layer entirely covering the base layer and a periphery of the organic layer.

In some embodiments, the organic emission layer comprises at least one small-molecule organic substance. In some embodiments, the organic layer comprises at least one of a hole injection layer, a hole transport layer, an electron injection layer, an electron transport layer, and a hole blocking layer.

In some embodiments, the base layer further comprises a dummy pixel region.

Some embodiments further comprise an electrode wiring portion disposed on a side of the display region and electrically coupled to the second electrode layer, wherein second electrode layer covers the electrode wiring portion.

Some embodiments further comprise a planarization film between the TFT devices and the first electrodes.

In some embodiments, the second electrode layer comprises a transparent material.

Some embodiments further comprise a device unit configured for sending signals to the display region and a power supply unit supplying electric power to the display region, wherein the device unit and the power supply unit are formed on the substrate.

Some embodiments further comprise an encapsulating structure disposed on the substrate sealing the display region. In some embodiments, the encapsulating structure comprises alternate organic layers and inorganic layers disposed over the display region.

Other embodiments provide an organic light emitting display apparatus comprising: a substrate comprising a plurality of TFT devices; and a display region formed on the substrate, wherein the display region comprises: a base layer comprising a plurality of pixel defining layers and a plurality of first electrodes electrically coupled to the TFT devices; an organic layer covering the plurality of pixel defining layers and the plurality of first electrodes, wherein the organic layer comprises an organic emission layer disposed on the first electrodes and between the pixel defining layers; and a second electrode layer covering the organic layer, and forming a margin with a width of greater than about 100 μm around the periphery of the organic layer.

In some embodiments, the organic emission layer comprises at least one small-molecule organic substance. In some embodiments, the organic layer comprises at least one of a hole injection layer, a hole transport layer, an electron injection layer, an electron transport layer, and a hole blocking layer.

In some embodiments, the base layer further comprises a dummy pixel region.

Some embodiments further comprise an electrode wiring portion disposed on a side of the display region and electrically coupled to the second electrode layer, wherein the second electrode layer covers the electrode wiring portion.

Some embodiments further comprise a planarization film disposed between the TFT devices and the first electrodes.

In some embodiments, the second electrode layer comprises a transparent material.

Some embodiments further comprise at least one of a device unit configured for sending signals to the display region and a power supply unit supplying electric power to the display region.

Some embodiments further comprise an encapsulating structure disposed on the substrate and sealing the display region. In some embodiments, the encapsulating structure comprises alternate organic layers and inorganic layers disposed over the display region.

BRIEF DESCRIPTION OF THE DRAWINGS

The above and other features and advantages of the present invention will become more apparent by describing in detail exemplary embodiments thereof with reference to the attached drawings, in which.

DETAILED DESCRIPTION OF CERTAIN EMBODIMENTS

Certain embodiments will now be described more fully with reference to the accompanying drawings, in which exemplary embodiments are shown.

Figure 1:
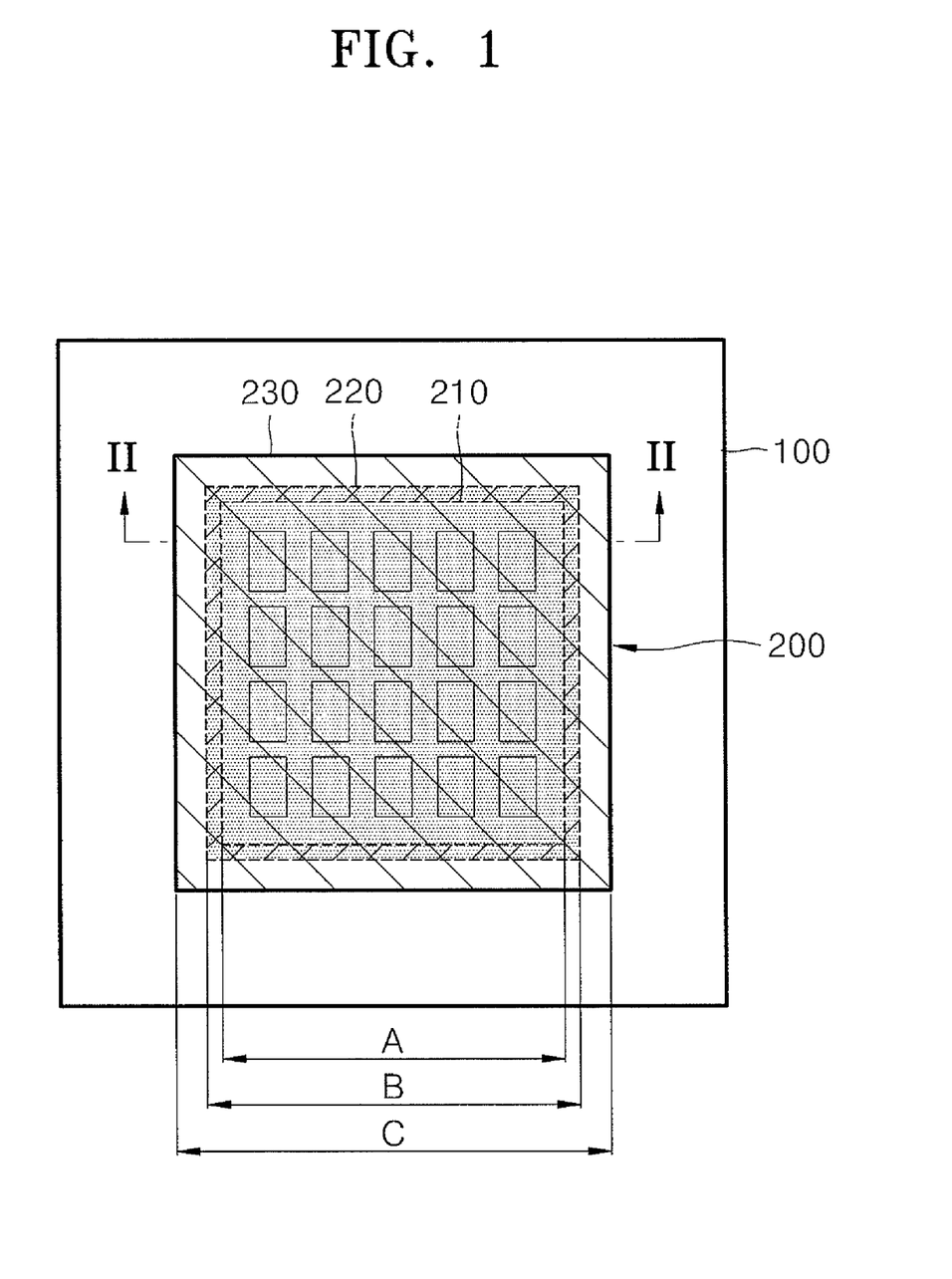
FIG. 1 is a schematic plan view of an organic light emitting display apparatus according to one embodiment.
Figure 2:
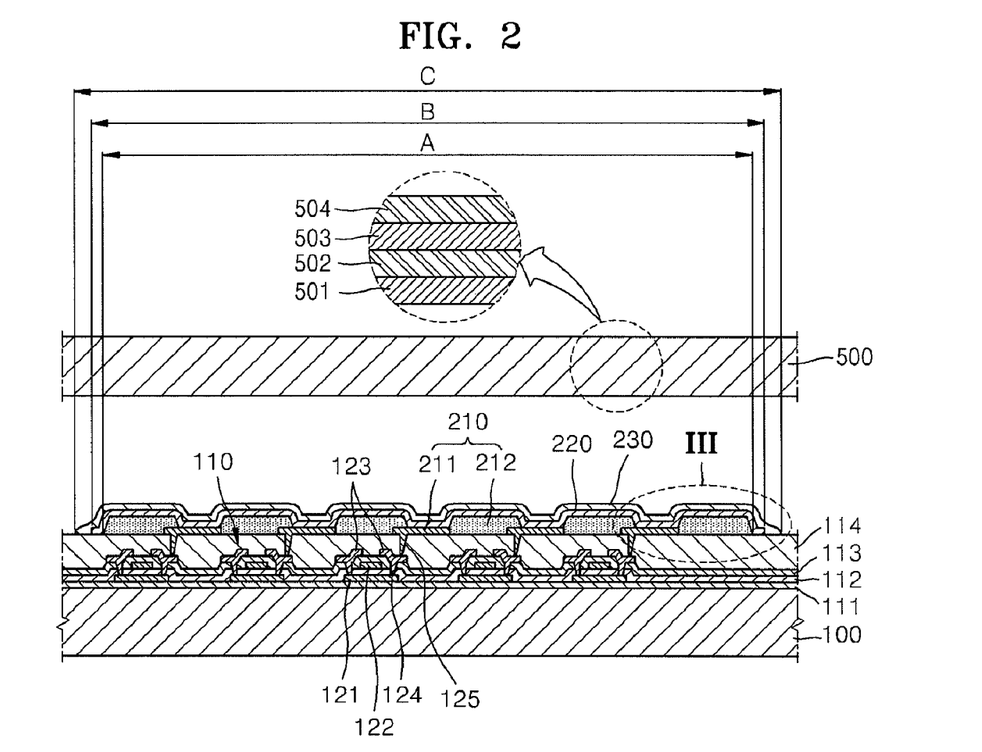
FIG. 2 is a cross-sectional view of the apparatus of FIG. 1 taken along section line II-II.
Figure 3:
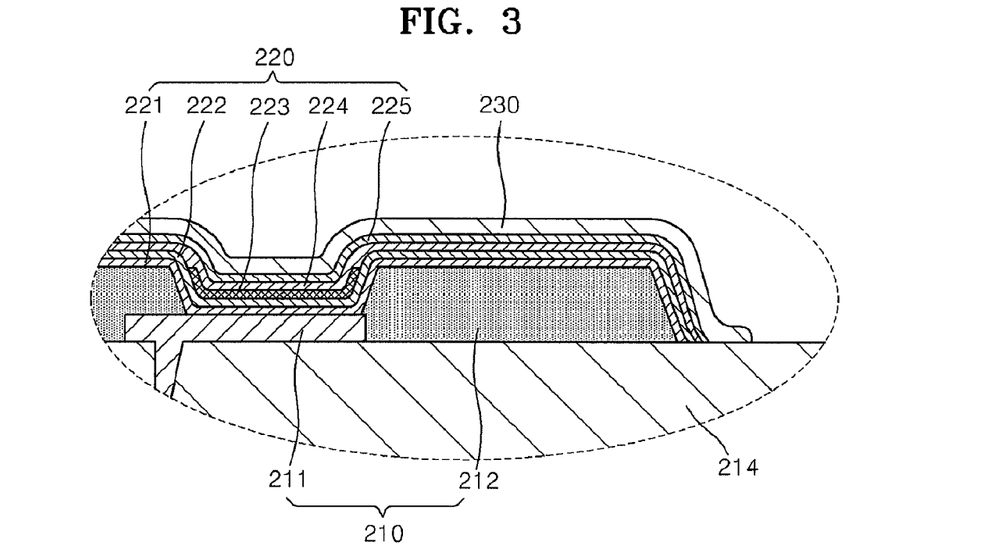
FIG. 3 is an enlarged view of detail III in FIG. 2.

FIGS. 1 through 3 illustrate an organic light emitting display apparatus according to one embodiment. FIG. 1 is a schematic plan view of the organic light emitting display apparatus of the current embodiment. FIG. 2 is a cross-sectional view of the apparatus of FIG. 1 taken along section line II-II, and FIG. 3 is an enlarged cross-sectional view of detail III in FIG. 2. Referring to FIGS. 1 through 3, the organic light emitting display apparatus includes a display region 200 including a base layer 210, an organic layer 220, and a second electrode layer 230 on a substrate 100, which includes a plurality of thin film transistor (TFT) devices 110 (FIG. 2), wherein the second electrode layer 230 entirely covers the base layer 210 and the organic layer 220.

The substrate 100 according to the current embodiment can be formed of various materials including glass, plastic, such as an acrylic, metal, and the like. As best seen in FIG. 2, a buffer layer 111, which is formed of $SiO_2$, or the like, is formed on the substrate 100. The buffer layer 111 prevents moisture or impurities from the substrate 100 from diffusing therethrough, and/or helps crystallization of a semiconductor layer 121 by controlling a heat transmission speed during crystallization.

The semiconductor layer 121 can be formed of an amorphous silicon thin film or a polycrystalline silicon thin film on the buffer layer 111. The semiconductor layer 121 can also be formed of an organic semiconductor material. Although not shown in FIGS. 1 through 3, the semiconductor layer 121 can include source regions and drain regions, which are doped with N-type or P-type dopants, and channel regions as necessary.

A gate electrode 122 is disposed above the semiconductor layer 121. A source electrode and a drain electrode electrically communicate with each other according to signals applied to the gate electrode 122. The gate electrode 122 is formed of a material such as MoW, Al/Cu, and the like, in consideration of closeness to adjacent layers, surface flatness of layers to be deposited, and processability.

A gate insulation film 112, which is formed of $SiO_2$ or the like, for example by plasma enhanced chemical vapor deposition (PECVD), is formed between the semiconductor layer 121 and the gate electrode 122 as an insulator between them. Using $SiO_2$, $SiN_x$, or the like, a single or a plurality of inter-insulator layers 113 are formed above the gate electrode 122 such that each of source and drain electrodes 123 contacts the source and drain regions of semiconductor layer 121 through contact holes 124 formed therethrough.

A planarization film 114 is disposed on the source and drain electrodes 123 to protect and planarize the thin film transistors 110. Additionally, a passivation layer in various forms, not shown in FIGS. 1 through 3, can be disposed between the planarization film 114 and the inter-insulator 113.

Although only the thin film transistor devices 110, which are connected to pixel electrodes 211, are illustrated in FIG. 2, the organic light emitting display apparatus of the current embodiment can further include a switching device. Moreover, various devices such as a capacitor can be included as desired, and the number of devices is not limited. In addition, the thin film transistors 110 illustrated in FIG. 2 are top-gate-type devices. However, the thin film transistor devices are not limited thereto, and bottom-gate-type devices in which gate electrodes 122 are formed below semiconductor layers 121 can also be included in some embodiments.

A base layer 210, which includes first electrodes 211 and defines pixel regions, is formed on the planarization film 114. Here, "a pixel region" refers not only to a pixel itself, which includes an emission layer, but also to structures which separate each pixel and define each pixel's emission region such as a pixel defining layer 212. In the current embodiment, the pixel defining layer 212 is formed between first electrodes 211 with a predetermined thickness.

The first electrodes 211 are electrically coupled to the source or drain electrodes 123 below through holes 125. The first electrodes 211 can be of a transparent or reflective type. Transparent type electrodes can be formed of indium tin oxide (ITO), indium zinc oxide (IZO), ZnO, $In_2O_3$, or the like. In the current embodiment, reflective anodes are used. The reflective anodes can be formed using ITO, IZO, ZnO, $In_2O_3$, or the like on a reflective film after forming the reflective film using Ag, Mg, Al, Pt, Pd, Au, Ni, Nd, Ir, Cr, and alloys and/or mixtures thereof.

The pixel defining layers (PDLs) 212 are formed between first electrodes 211 with a predetermined thickness. In addition to defining emission regions, the PDLs 212 prevent short circuits between the first electrodes 211 and the second electrodes 230 by reducing the concentration of electric field at edge portions of the first electrodes 211 by increasing the distance between the edges of first electrodes 211 and the second electrodes 230. The base layer 210 according to the current embodiment includes the PDLs 212; however, in other embodiments, any structure separating each pixel and defining an emission region of each pixel can form the base layer 210.

As best seen in FIG. 3, the organic layer 220, including at least an organic emission layer 223, are formed on the base layer 210. Because the organic layer 220 comprises a plurality of layers, the organic layer 220 is also referred to as "organic layers 220." The organic emission layer 223 can comprise small-molecule or polymeric organic substances. When the organic emission layer 223 comprises polymeric organic substances, the organic emission layer 223 includes a hole transport layer and an emission layer. In some embodiments, polyethylenedioxythiophene (PEDOT) is used for the hole transport layer and polymeric organic substances, such as polyphenylenevinylenes (PPVs) and polyfluorenes, are used for the emission layer.

In embodiments comprising small-molecule organic substances, the organic emission layer 223 can be formed by depositing a hole injection layer (HIL) 221, a hole transport layer (HTL) 222, an emission layer (EML) 223, an electron transport layer (ETL) 224, an electron injection layer (EIL) 225, and the like, as single layers or in a more complex structure as illustrated in FIG. 3. Examples of organic substances that can be used for depositing the organic emission layer include copper phthalocyanine (CuPc), N,N'-di(naphthalene-1-yl)-N,N'-diphenyl-benzidine (NPB), tris-8-hydroxyquinoline aluminum ($Alq_3$), and the like.

In some embodiments, some of the organic layers 220 do not entirely cover a pixel region, that is, only certain portions of some of the organic layers 220 are selectively formed as desired. Although not illustrated in FIG. 3, a hole blocking layer (HBL) can further be disposed between the emission layer 223 and the electron transport layer 224. Likewise, some embodiments of the organic layers 220 include various other organic layers. Also, when the first electrodes 211 function as cathodes and the second electrodes 230 function as anodes, the order of the organic layers 220 is changed as would be understood by those skilled in the art.

The small-molecule organic layers 220 are formed on the base layer 210 by vacuum deposition using a mask. In the current embodiment, the organic emission layer 223 is formed by patterning each first electrode for each pixel using a fine mask, and the other organic layers 221, 222, 224, and 225 are sequentially deposited on the base layer 210 through an open mask without being patterned for each pixel.

Referring to FIGS. 1 and 2, the organic layers 220 including the emission layer are deposited on area B, which has either the same area or a slightly larger area than area A of the base layer 210. The open mask for depositing the organic layers 221, 222, 224 and 225 is usually designed so that area B over which the organic layers 220 are deposited covers area A over which the base layer 210 is deposited.

FIGS. 1 and 2 illustrate an embodiment in which the organic layers 221, 222, 224, and 225 are ideally aligned over the base layer 210; that is, in which area B, where the organic layers 220 are deposited, entirely covers area A, where the base layer 210 is deposited. Moreover, when a second electrode layer 230 is deposited over area C completely covering area B, edges of the organic layers 220 are not exposed because the second electrode layer 230 also entirely covers the organic layers 220. Therefore, external moisture and/or oxygen cannot penetrate between interstices at the edges of the organic layers 221, 222, 224, and 225 of the organic layers 220.

Figure 4:
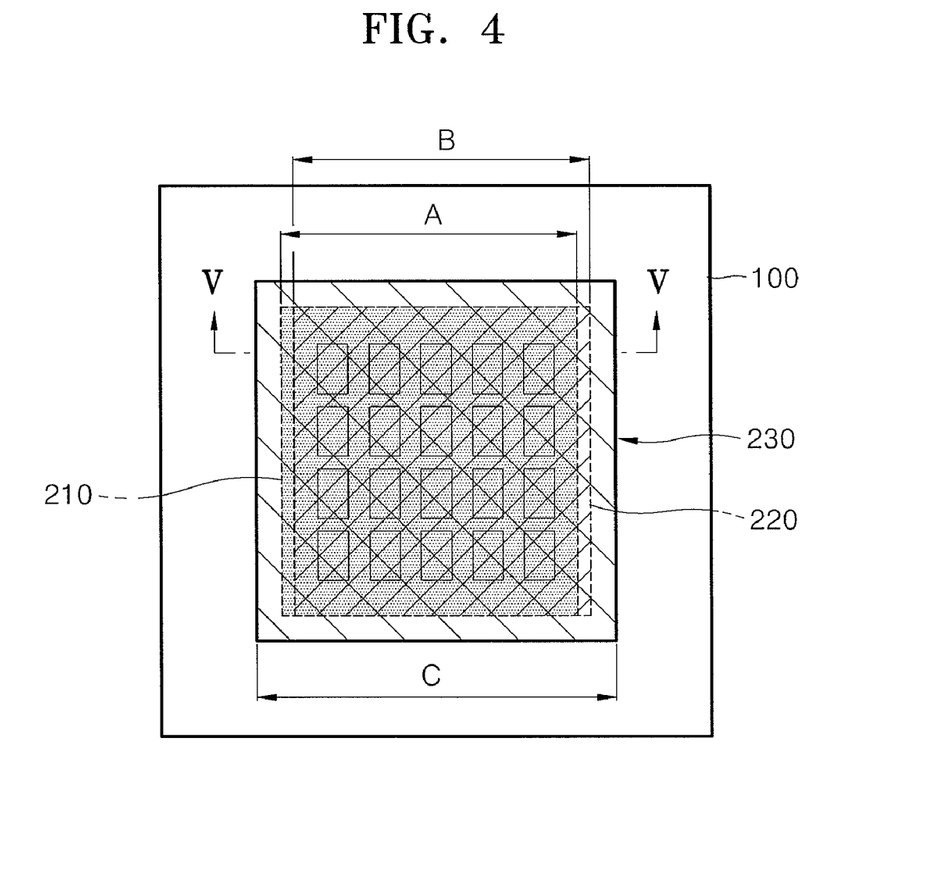
FIG. 4 is a plan view of an organic light emitting display apparatus according to another embodiment.
Figure 5:
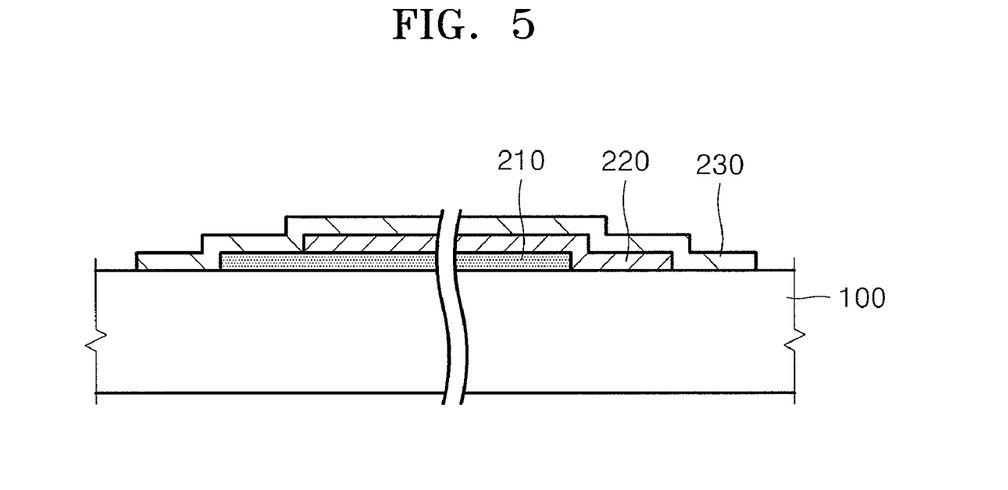
FIG. 5 is a cross-sectional view of the apparatus of FIG. 4 taken along section line V-V.

However, when depositing the organic layers 220, there are instances in which the organic layers 220 are not ideally aligned over the base layer 210 as described above. FIGS. 4 and 5 illustrate an embodiment in which the organic layers 220 are not ideally aligned over the base layer, yet are not exposed to exterior on any side of the second electrodes 230.

The open mask used in depositing the organic layers 221, 222, 224, and 225 is designed to cover at least area A where the base layer 210 is formed. However, due to manufacturing tolerances in the process of manufacturing the mask or alignment errors in aligning the mask on the substrate 100, the organic layers 220 are not deposited ideally on the base layer 210.

FIGS. 4 and 5 illustrate an embodiment in which the manufacturing tolerances of the right and left sides of the mask used for deposition of the organic layers 221, 222, 224, and 225 are off, or when the organic layers 220 are deposited with the mask misaligned to the right side because an alignment error. Referring to FIGS. 4 and 5, the organic layers 220 are formed to the right side on the base layer 210; however the organic layers 220 are not exposed to the external environment on the left side because the second electrode layer 230 is formed over area C, which entirely covers area A, where the base layer 210 is formed, in addition to area B, where the organic layers 220 are formed.

Figure 6:
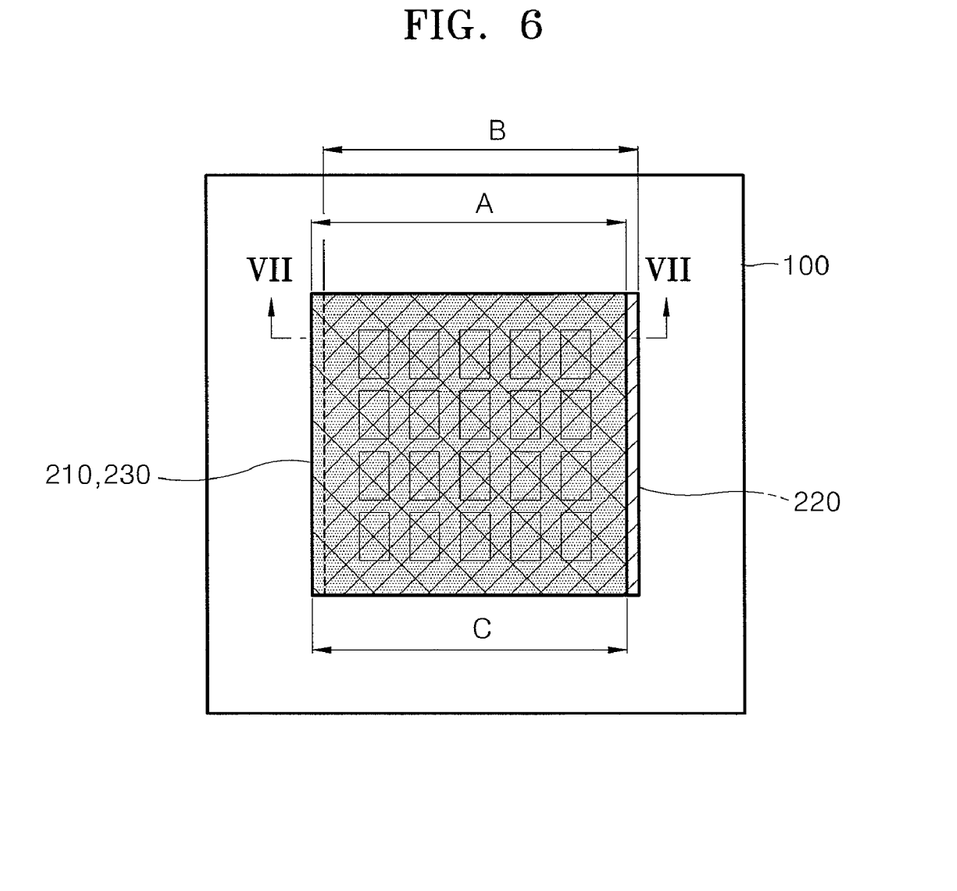
FIG. 6 is a plan view of an organic light emitting display apparatus according to a comparative example.
Figure 7:
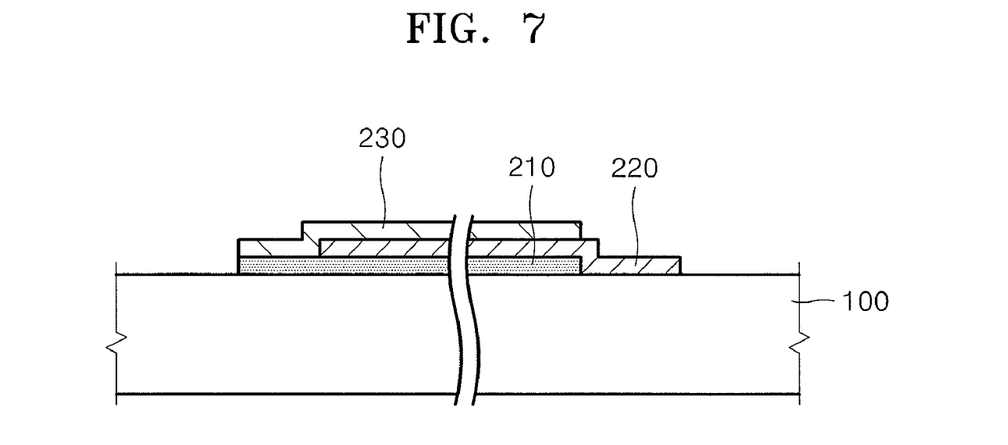
FIG. 7 is a cross-sectional view of the apparatus of FIG. 6 taken along section line VII-VII.

In the embodiment illustrated in FIGS. 6 and 7, organic layers 220 are formed to the right side on the base layer 210 as in FIGS. 4 and 5. That is, area B, where the organic layers 220 are formed, is at the right side, extending slightly beyond area A, where the base layer 210 is formed. If the manufacturing tolerances of the mask used in depositing the organic layers 220, or alignment errors when aligning the mask on the base layer 210 are not taken into consideration when depositing a second electrode layer 230, the second electrode layer 230 usually covers the area where the base layer 210 is formed. In this case, the right edges of organic layers 220 are not entirely covered by the second electrode layer 230, as in the embodiment illustrated in FIGS. 4 and 5. Thus, moisture and oxygen can reach the organic emission layer 223 through interstices between the exposed edges of organic layers 220, causing deterioration of the organic emission layer 223.

However, in the organic light emitting display apparatus according to the embodiments illustrated in FIGS. 1-5, the second electrode layer 230 covers both the base layer 210 and the organic layers 220. Thus, deterioration of the organic emission layer 223 due to exposure of the organic layers 220 to the external environment can largely be prevented and thus the life span of the organic light emitting display apparatus can be extended.

The second electrode layer 230 can comprise transparent or reflective electrodes. When the second electrode layer 230 comprises transparent electrodes, metals with low work functions such as Li, Ca, LiF/Ca, LiF/Al, Al, Ag, Mg, and alloys and mixtures thereof are thinly deposited over the organic emission layer, and an auxiliary electrode layer or bus electrode lines can be formed on the second electrode layer 230 using materials suitable for transparent electrodes such as ITO, IZO, ZnO, $In_2O_3$, or the like. Using reflective electrodes, the second electrode layer 230 is formed by depositing, for example, Li, Ca, LiF/Ca, LiF/Al, Al, Ag, Mg, or alloys and/or mixtures thereof, on the entire surface. Second electrode layer 230 according to the current embodiment, which are formed of light-permeable electrodes, function as cathodes of organic emission layer 223 and as common electrodes.

Embodiments in which the organic layers 220, except for the emission layer 223, are formed using an open mask are described above. However, those skilled in the art will understand that depositing some or all of the organic other layers 220 for each pixel using a fine mask is also possible. The organic emission layer 223 is usually formed on a central portion of each pixel, in other words, on the first electrode 211 between pixel defining layers 212, and the materials forming the organic emission layer 223 can be disposed slightly out of the position of each pixel of the base layer 210 due to manufacturing tolerances of the fine mask or alignment errors of the mask. Even in this case, deterioration due to exposure of the organic emission layer 223 can be prevented if the second electrode layer 230 covers both the base layer 210 and the organic layers 220 including the organic emission layer 223.

Figure 8:
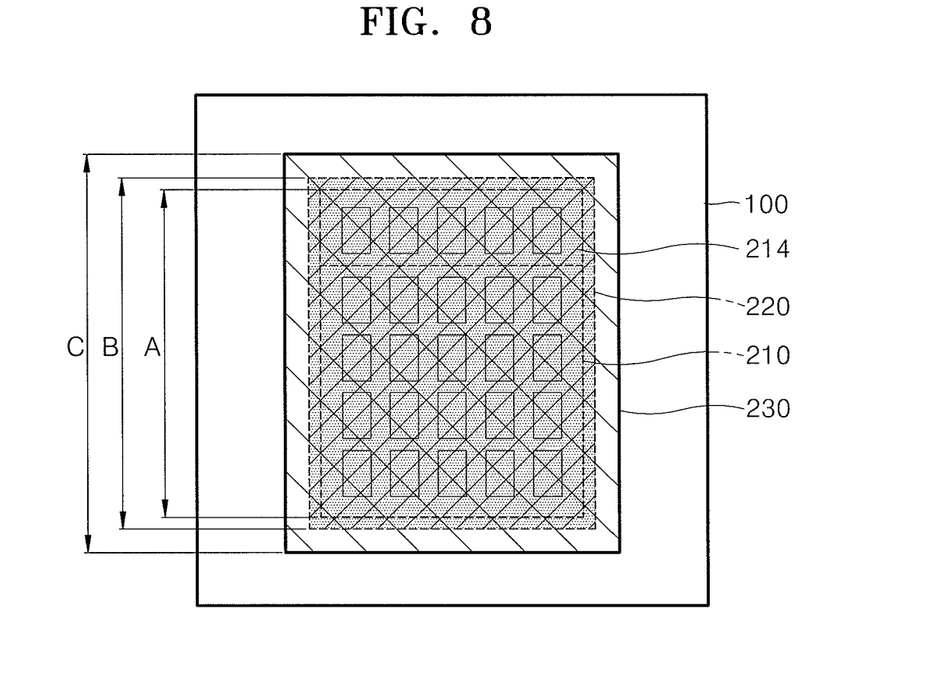
FIG. 8 is a schematic plan view of an organic light emitting display apparatus according to still another embodiment.

FIG. 8 is a schematic plan view of an organic light emitting display apparatus according to another embodiment. Referring to FIG. 8, a base layer 210 formed in area A includes a dummy pixel region 214 in addition to first electrodes and a pixel region. Organic layers 220 are formed in area B on the base layer 210 including the dummy pixel region 214, and a second electrode layer 230 is formed in area C on the organic layers 220.

When manufacturing organic light emitting display apparatuses, it is desirable to check whether pixels are correctly formed or to test features of TFTs of each pixel. Some embodiments use one or more parts of a dummy pixel for such testing. The parts of the dummy pixel can include portions of a display device for light emission, or devices such as a TFT, which control the display device.

According to the current embodiment, the organic layers 220 are formed on the base layer 210 including the dummy pixel region 214 of a display device, and the second electrode layer 230 entirely covers the base layer 210 and the organic layers 220. Therefore, the organic layers 220 formed on the dummy pixel region 214, which is used to test the display device, are formed at the periphery of a display region and thus have high risk of being exposed to the exterior. However, the organic layers 220 are completely covered by the second electrode layer 230 according to the current embodiment, and thus permeation of external moisture and oxygen thereto can be prevented.

In FIG. 8, the dummy pixel region 214 is formed at one side of the display region. However, those skilled in the art will understand that in other embodiments, the dummy pixel region can also be formed at one or more other sides along the periphery of the display region.

Figure 9:
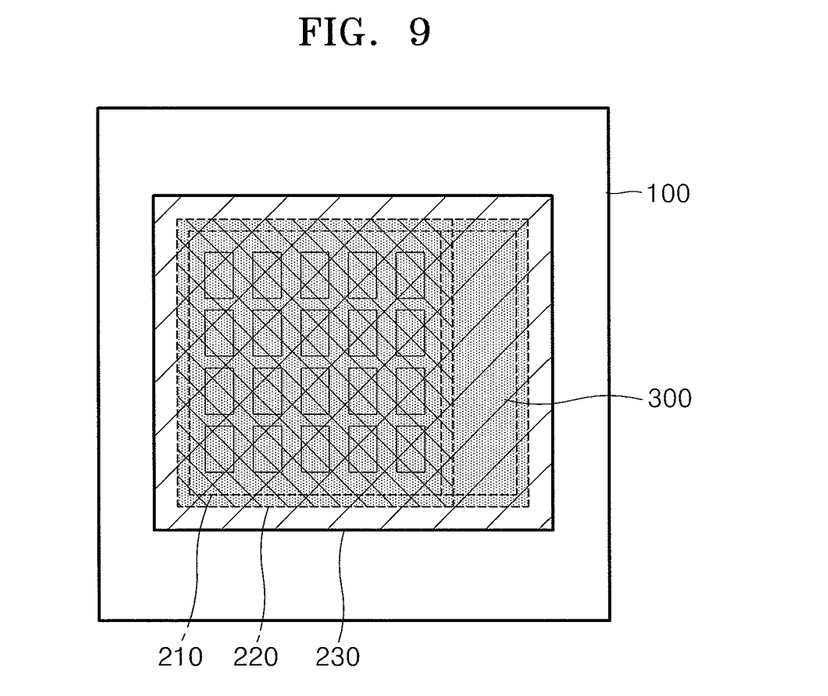
FIG. 9 is a schematic plan view of an organic light emitting display apparatus according to still another embodiment.

FIG. 9 is a schematic plan view of an organic light emitting display apparatus according to still another embodiment. Referring to FIG. 9, a display region includes a base layer 210, organic layers 220, and a second electrode layer 230, all formed on a substrate 100. An electrode wiring portion 300 is electrically coupled to the second electrode layer 230 and is formed on one side of the display region.

The electrode wiring portion 300 supplies the second electrode layer 230, which operates as a common electrode, with electric power. The second electrode layer 230 according to the current embodiment covers the electrode wiring portion 300. An insulation layer is disposed between the second electrode layer 230 and the electrode wiring portion 300, and the second electrode layer 230 and the electrode wiring portion 300 are interconnected through a plurality of contact holes.

In the organic light emitting display apparatuses including an electrode wiring portion 300, organic layers 220 formed on a base layer 210 are not formed on the electrode wiring portion 300; however a second electrode layer 230 is formed on the electrode wiring portion 300. Therefore, in embodiments in which the organic layers 220 are deposited on the right-left and/or top/bottom areas of the display area, instances are atypical in which the second electrode layer 230 does not cover the portion(s) of the organic layers 220 adjacent to the electrode wiring portion 300. However, when organic layers 220 are deposited on the side(s) of the display area at which the electrode wiring portion 300 is not formed, the organic layers 220 may not completely cover the base layer 210. Nevertheless, the second electrode layer 230 according to the current embodiment covers the base layer 210 and the organic layers 220 even in these cases, and thus prevents exposure of the organic layers 220 to the external environment.

Further, the organic light emitting display apparatus according to the current embodiment can include an encapsulating structure 500, as shown in FIG. 2, that seals the display region. In the organic light emitting display apparatus according to the current embodiment, the second electrode layer completely encloses the organic layers and thus largely prevents external oxygen and moisture from permeating through the organic layers. However, external oxygen and moisture can be blocked more effectively by further including a structure 500 that encapsulates the display region. Examples of encapsulating structures include any suitable encapsulating structure, for example, a metal cap with a sealant, an encapsulating substrate with a sealant, or a thin encapsulating structure formed by alternately depositing insulating organic and inorganic layers 501, 502, 503, and 504, as shown in FIG. 2. Thus, various encapsulating structures sealing the display region using various substances and methods can further be included.

Figure 10:
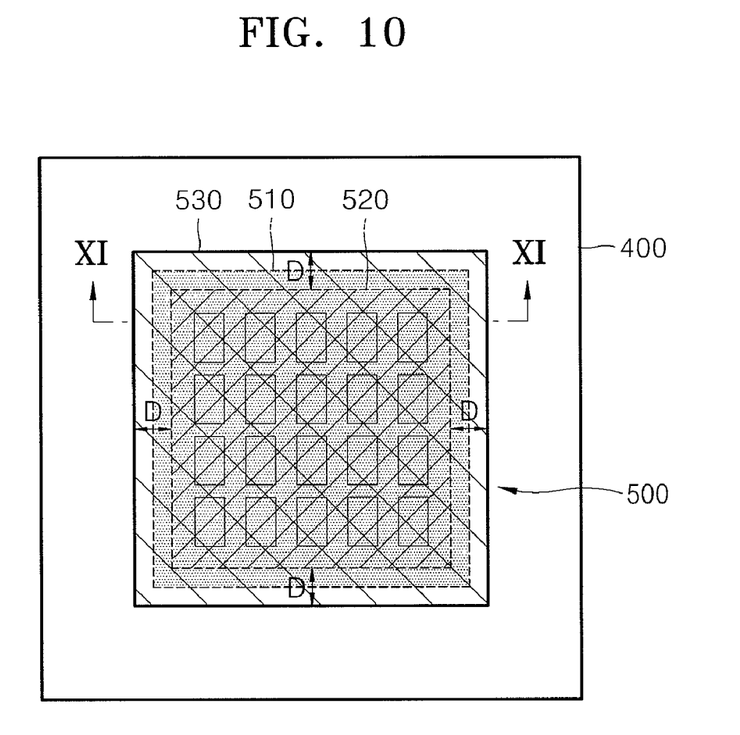
FIG. 10 is a schematic plan view of an organic light emitting display apparatus according to still another embodiment.
Figure 11:
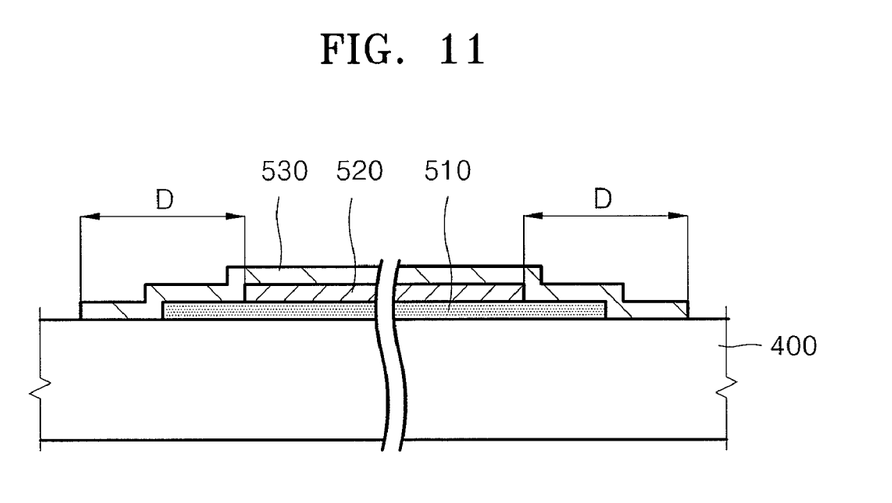
FIG. 11 is a cross-sectional view taken along section line XI-XI of FIG. 10.
Figure 12:
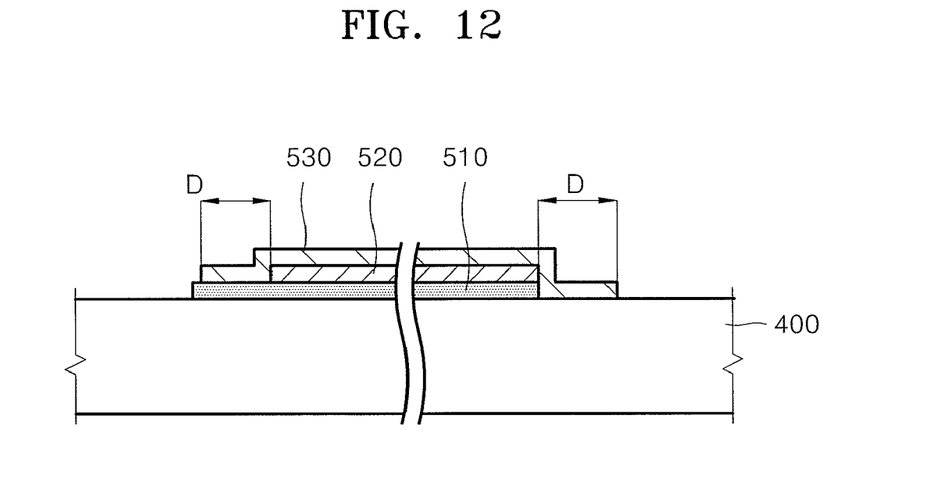
FIGS. 12 and 13 are schematic plan views of organic light emitting apparatuses according to other embodiments.
Figure 13:
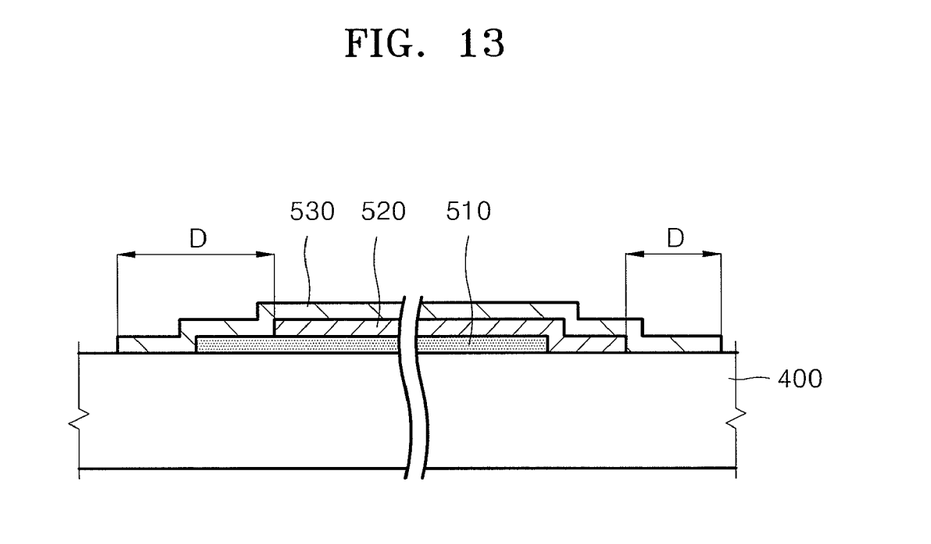

FIGS. 10 through 13 illustrate an organic light emitting display apparatus according to still another embodiment. FIG. 10 is a schematic plan view of the organic light emitting display apparatus, and FIG. 11 is a schematic cross-sectional view taken along section line XI-XI of FIG. 10. FIGS. 12 through 13 are schematic cross-sectional views of organic light emitting display apparatuses according to other embodiments.

Referring to FIGS. 10 through 13, the organic light emitting display apparatus according to the current embodiments includes a display region 500 including a base layer 510, organic layers 520 and a second electrode layer 530 on a substrate 400 including a plurality of TFT devices, wherein the second electrode layer 530 covers the organic layers 520, extending past the periphery thereof by a width D of greater than about 100 μm. Hereinafter, some differences between the organic light emitting display apparatus according to the current embodiment and the organic light emitting display apparatus according to the previous embodiments are described.

First, the second electrode layer 530 of the current embodiment entirely covers the organic layers 520, but may or may not cover the base layer 510. FIGS. 10 and 11 illustrate an instance in which the second electrode layer 530 covers both the base layer 510 and organic layers 520, extending beyond the periphery of the organic layers by a width D. On the other hand, FIG. 12 illustrates an instance in which the second electrode layer 530 covers the organic layers 520, extend past the periphery by a width D, but does not cover the left side edge of the base layer 510. In the organic light emitting display apparatus according to some of the previous embodiments, the organic layers 220 are designed to cover at least the base layer 210 and thus the second electrode layer 230 covering the organic layers 220 also covers the base layer 210. On the contrary, the current embodiment includes instances in which the organic layers 520 does not entirely cover the base layer 510, and includes an instance in which a pixel defining layer formed on the outer periphery of display region is not covered with the organic layers 520.

In addition, in the current embodiments, an error of about 100 μm can occur in depositing the organic layers 520 using a mask, manufacturing tolerances for the mask are about 50 μm, and alignment errors in aligning the mask on the substrate are about 50 μm. That is, a maximum error of about 100 μm in position in the process of depositing the organic layers 520 on the substrate 400 is taken into account. Thus, since the dimension of the second electrode layer 530 is larger than the organic layers 520 by greater than about 100 μm along the periphery thereof, the second electrode layer 530 completely covers the organic layers 520. That is, the second electrode layer 530 covers the sides of the organic layers 520, extending past the periphery thereof by greater than about 100 μm even when the organic layers 520 are deposited out of the position.

FIGS. 10 through 12 illustrate an instance in which the region on which the organic layers 520 are deposited is smaller than the region on which the base layer 510 is deposited. However, those skilled in the art will understand that in some embodiments, the region of organic layers 520 is larger than or the same as the region of base layer 510. Referring to FIG. 13, even when the organic layers 520 are formed over the right edge of the base layer 510 due to manufacturing tolerances or alignment errors, external oxygen or moisture can still be prevented from reaching the organic layers 520 by forming the second electrode layer 530 to cover the organic layers 520 with a margin of width D around the periphery thereof.

Although not described in the above embodiments and drawings, the organic light emitting display apparatuses according to some embodiments can further include, for example, a device unit for sending signals, a power supply unit for supplying electric power, and the like, formed on the substrate, in addition to a display region. Also, it will be understood by those of ordinary skill in the art that various functional means in various forms may be further included therein.

Advantages provided by the organic light emitting display apparatuses according to the embodiments of the present invention include one or more of the following. First, deterioration of an emission layer due to exterior moisture and oxygen can be reduced or prevented by covering the organic layers with a second electrode layer regardless of the manufacturing tolerances of a mask for depositing the organic layers. Second, deterioration of an emission layer due to external moisture and/or oxygen infiltration can be prevented by covering the organic layers with the second electrode layer regardless of the alignment errors which can occur when aligning the substrate and mask for depositing the organic layers.

While certain embodiments been particularly shown and described herein, it will be understood by those of ordinary skill in the art that various changes in form and details may be made therein without departing from the spirit and scope of the present disclosure as defined by the following claims.

What is claimed is:

1. An organic light emitting display apparatus comprising:
a substrate; and
a display region formed on the substrate, wherein the display region comprises:
a plurality of thin file transistor (TFT) devices,
a pixel defining layer, comprising a plurality of gaps,
a plurality of first electrodes electrically coupled to the TFT devices,
an organic layer covering the pixel defining layer and the plurality of first electrodes, wherein the organic layer comprises an organic emission layer disposed on the first electrodes in the gaps of the pixel defining layers, and a second electrode layer entirely covering the pixel defining layer and all peripheral boundaries of the organic layer.

2. The organic light emitting display apparatus of claim 1, wherein the organic emission layer comprises at least one small-molecule organic substance.

3. The organic light emitting display apparatus of claim 2, wherein the organic layer comprises at least one of a hole injection layer, a hole transport layer, an electron injection layer, an electron transport layer, and a hole blocking layer.

4. The organic light emitting display apparatus of claim 1, wherein the pixel defining layer and the plurality of first electrodes further comprises a dummy pixel region, wherein the second electrode layer covers the dummy pixel region.

5. The organic light emitting display apparatus of claim 1, further comprising an electrode wiring portion disposed on a side of the display region and electrically coupled to the second electrode layer, wherein second electrode layer covers the electrode wiring portion.

6. The organic light emitting display apparatus of claim 1, further comprising a planarization film between the TFT devices and the first electrodes.

7. The organic light emitting display apparatus of claim 1, wherein the second electrode layer comprises a transparent material.

8. The organic light emitting display apparatus of claim 1, further comprising a device unit configured for sending signals to the display region and a power supply unit supplying electric power to the display region, wherein the device unit and the power supply unit are formed on the substrate.

9. The organic light emitting display apparatus of claim 1, further comprising an encapsulating structure disposed on the substrate sealing the display region.

10. The organic light emitting display apparatus of claim 9, wherein the encapsulating structure comprises alternate organic layers and inorganic layers disposed over the display region.

11. An organic light emitting display apparatus comprising:
a substrate; and
a display region formed on the substrate, wherein the display region comprises:
a plurality of thin file transistor (TFT) devices,
a pixel defining layer,
and a plurality of first electrodes electrically coupled to the TFT devices,
an organic layer covering the pixel defining layer and the plurality of first electrodes, wherein the organic layer comprises an organic emission layer disposed on the first electrodes and between the pixel defining layer, and
a second electrode layer covering the organic layer and all peripheral boundaries of the organic layer, and forming a margin with a width of greater than about 100 µm around the periphery of the organic layer.

12. The organic light emitting display apparatus of claim 11, wherein the organic emission layer comprises at least one small-molecule organic substance.

13. The organic light emitting display apparatus of claim 12, wherein the organic layer comprises at least one of a hole injection layer, a hole transport layer, an electron injection layer, an electron transport layer, and a hole blocking layer.

14. The organic light emitting display apparatus of claim 11, wherein the pixel defining layer and the plurality of first electrodes further comprises a dummy pixel region, wherein the second electrode layer covers the dummy pixel region.

15. The organic light emitting display apparatus of claim 11, further comprising an electrode wiring portion disposed on a side of the display region and electrically coupled to the second electrode layer, wherein the second electrode layer covers the electrode wiring portion.

16. The organic light emitting display apparatus of claim 11, further comprising a planarization film disposed between the TFT devices and the first electrodes.

17. The organic light emitting display apparatus of claim 11, wherein the second electrode layer comprises a transparent material.

18. The organic light emitting display apparatus of claim 11, further comprising at least one of a device unit configured for sending signals to the display region and a power supply unit supplying electric power to the display region.

19. The organic light emitting display apparatus of claim 11, further comprising an encapsulating structure disposed on the substrate and sealing the display region.

20. The organic light emitting display apparatus of claim 18, wherein the encapsulating structure comprises alternate organic layers and inorganic layers disposed over the display region.

* * * * *